US006198166B1

(12) United States Patent
Coronati

(10) Patent No.: US 6,198,166 B1
(45) Date of Patent: Mar. 6, 2001

(54) POWER SEMICONDUCTOR MOUNTING PACKAGE CONTAINING BALL GRID ARRAY

(75) Inventor: John Michael Coronati, Mountaintop, PA (US)

(73) Assignee: Intersil Corporation, Palm Bay, FL (US)

( * ) Notice: Subject to any disclaimer, the term of this patent is extended or adjusted under 35 U.S.C. 154(b) by 0 days.

(21) Appl. No.: 09/345,930

(22) Filed: Jul. 1, 1999

(51) Int. Cl.[7] .......................... H01L 23/04; H01L 23/13; H01L 23/15; H01L 23/48; H01L 29/40
(52) U.S. Cl. .................... 257/738; 257/690; 257/704; 257/730
(58) Field of Search .................................. 257/678, 690, 257/704, 730, 738, 782

(56) References Cited

U.S. PATENT DOCUMENTS 5,909,056 * 6/1999 Mertol ................................. 257/704
6,097,085 * 8/2000 Ikemizu et al. ..................... 257/678

* cited by examiner

Primary Examiner—David Mis
(74) Attorney, Agent, or Firm—Jaeckle Fleischmann Mugel, LLP

(57) ABSTRACT

A package for mounting a power semiconductor device to a printed circuit board comprises a dielectric ceramic plate having an upper and lower surface and a grid array of holes penetrating the plate. A plurality of conductive metal contact pads that provide electrical contact for the power semiconductor device are disposed on the upper surface of the ceramic plate, and a conductive metal fills the holes. The metal-filled holes are connected to the conductive metal contact pads and provide vias from the pads to the lower surface of the ceramic plate. An array of solder balls, each ball being attached to a via at the lower surface of the ceramic plate, provide connection terminals to the printed circuit board. Sidewalls are sealably connected to the ceramic plate at its perimeter, and a lid is sealably connected to the sidewalls. The lid comprises, together with the sidewalls and ceramic plate, a hermetically sealed cavity that encloses the power semiconductor device and conductive metal contact pads.

10 Claims, 3 Drawing Sheets

POWER SEMICONDUCTOR MOUNTING PACKAGE CONTAINING BALL GRID ARRAY

FIELD OF THE INVENTION

The present invention relates generally to a semiconductor device package and, more particularly, to a package for mounting power semiconductor devices on a printed circuit board using a ball grid array.

BACKGROUND OF THE INVENTION

Because of the power dissipation requirements for power integrated circuits, the power electronics industry currently uses chip packages that do not conform to IC industry standards. Packages designed for surface mounting on printed circuit boards (PCBs) typically include large external rectangular contact pads that are usually formed from copper tungsten alloy or other similar conductive material to match the coefficient of expansion (CTE) of the alumina within the package.

The CTE of the copper/tungsten used in such pads does not accurately match the CTE of the printed circuit board. Consequently, solder fatigue of the pad/PCB joint is a significant problem in assembly and operation of a power switch, and the integrated circuit industry has developed no standard way to solve it. The problem is relatively small for low-power ICs, for which other solutions have been developed, but it much more serious for power switches with their higher operating temperatures and larger component sizes.

The IC industry has introduced PGAs (pin grid arrays) that allow for smaller footprints but does not directly solve the problem of solder fatigue. More recently, ICs that incorporate a ball grid array (BGA) do directly attack the solder fatigue problem between the package and board material by matching the CTE of the array more closely with that of the PCB.

Ceramic packaging technology is traditionally used to support high performance IC devices owing to the high reliability, thermal conductivity and excellent routability of ceramics. The material has a comparatively close coefficient of expansion (CTE) with silicon. Although the thermal conductivity characteristics of ceramic is an advantage for first-level interconnect, they present a problem for second-level mounting on the PCB for power devices.

A power device passes current from the bottom of the device to the top; therefore the die attach pad must be accessible to the outside of the package. Wirebonds are customarily used to direct the current from the top of the die to another pad accessible to the outside of the package, but wirebonding entails the use of resistive junctions between the wire and the pads at either end. Current passing through a resistive junction creates heat. In a power device, elevated resistance in a wirebond junction reduces the current, thereby limiting the power output, and exposes the device to a higher risk of failure from overheating resulting from inadequate dissipation of the heat being generated.

U.S. Pat. No. 5,406,120 to Jones describes a hermetically-sealed semiconductor ceramic package using a large heat dissipating plane brazed to a ceramic substrate, a wirebond method of making electrical connections to the die, a via method of connection through the hermetic seal, and the use of ceramic sidewalls for the hermetic package. The vias in Jones contain copper or other superior conductor plated with silver to facilitate conductive connection; the inner surfaces of the vias are metallized with a refractory metal. The resulting package is complex in its construction and non-standard in its overall form and PCB mounting, illustrating clearly the problems faced in mounting power devices simply and reliably on PCBs.

U.S. Pat. No. 5,726,493 to Yamashita et al. disclose a ball grid array structure for a semiconductor device in which the device is sealed with a sealing resin and an electrically conductive pin passing through the resin to serve as an electrode member.

U.S. Pat. No. 5,834,839 to Mertol describes a semiconductor package that includes solder balls and an encapsulant covering the semiconductor die and bond wires and forming a protruberance from the lower surface of the package substrate.

U.S. Pat. No. 5,909,058 to Yano et al. describes a semiconductor package and semiconductor mounting part that is focused principally on increasing the number of terminals and decreasing the package size for non-power ICs.

It would be desirable to extend a ball grid array (BGA) connection structure, which is advantageous for integrated circuits, to the attachment of power semiconductor devices to printed circuit boards. This benefit is realized by the present invention.

SUMMARY OF THE INVENTION

In accordance with the present invention, a package for mounting a power semiconductor device to a printed circuit board comprises a dielectric ceramic plate having an upper and lower surface and a grid array of holes penetrating the plate. A plurality of conductive metal contact pads that provide electrical contact for the power semiconductor device are disposed on the upper surface of the ceramic plate, and a conductive metal fills the holes. The metal-filled holes are connected to the conductive metal contact pads and provide vias from the pads to the lower surface of the ceramic plate.

An array of solder balls, each ball being attached to a via at the lower surface of the ceramic plate, provide connection terminals to the printed circuit board. Sidewalls are sealably connected to the ceramic plate at its perimeter, and a lid is sealably connected to the sidewalls. The lid comprises, together with the sidewalls and ceramic plate, a hermetically sealed cavity that encloses the power semiconductor device and conductive metal contact pads.

The package of the present invention enables power switches to be mounted to the PCB using BGA mounting technology that is standard for non-power devices, with attendant advantages of reliability and ease of board mounting. The package of the present invention provides lowered resistance and, consequently, less likelihood of overheating than power device packages currently in use.

DETAILED DESCRIPTION OF THE INVENTION

The power BGA package utilizes copper vias to transmit current from the upper plane to the lower plane. The board mounting technique uses solder balls, which can be formed from a lead-tin solder, combined with an underfill material to fill in the gaps between the vias and the board. The vias can be copper, aluminum, or any other good conducting material. Copper and aluminum are good conductors that expel heat and have very low resistivities. For connection to the vias to the solder ball grid array, the die mount pad and wirebond pads can either be direct bond copper attached or active metal brazed. The power device package traces are all made with highly conductive metals. Thus both the overall resistance of the package and its overall footprint are reduced compared to a standard SMID package. The package is seam sealed with a lid of Kovar, an alloy containing 52% nickel, 40% iron, and 8% cobalt, or other material having similar physical, thermal and electrical characteristics to maintain hermeticity standards that meet government requirements for high reliability products for the military and space/defense industries.

Figure 1A:
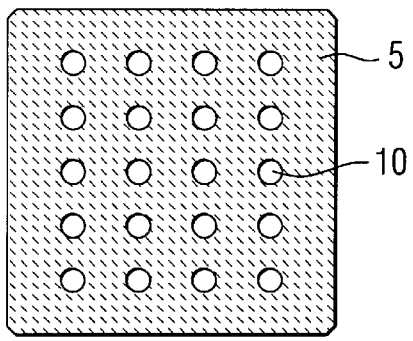
FIGS. 1 A–D depict a process for forming a package sub-assembly with paste vias through the ceramic plate.

FIGS. 1A–D illustrate the process for manufacture of a package sub-assembly with paste vias. As shown in FIG. 1A, a ceramic plate 5 formed from alumina or other material with similar CTE characteristics is used to insulate the contents of the sub-assembly from its exterior. Ceramic plate 5 may be purchased with holes 10 prepunched, or they may be subsequently formed by laser drilling.

Figure 1B:
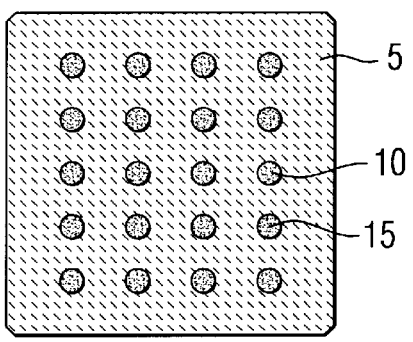
Figure 1C:
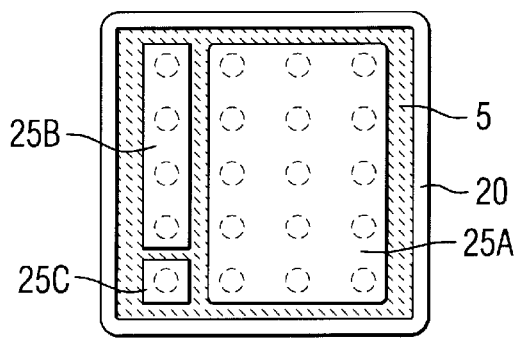

As further depicted in FIG. 1B, vias 15 are formed by filling holes 10 with a highly conductive metal paste such as copper or similar metal that has a CTE matched to the CTE of ceramic plate 5 to minimize physical stresses under varying temperature conditions. A copper seal ring 20 is active metal brazed to the periphery of ceramic plate 5, as shown in FIG. 1C, to facilitate later processing of a Kovar seal ring. Copper plates 25 A–C, which constitute contact pads for the die and wirebonds, are active metal brazed to metal vias 15. Plate 25A, for example, can be the contact pad for a MOSFET die, plate 25B can be the gate contact pad, and plate 25C the pad for an on-off control.

Figure 1D:
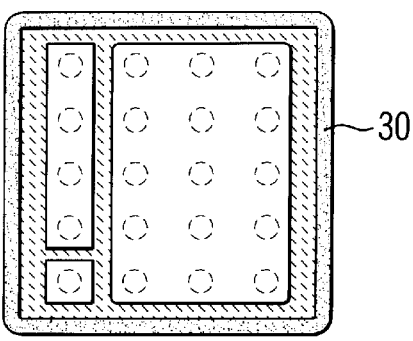

In FIG. 1D is shown a Kovar seal ring 30, which provides sidewalls for the package and is brazed to copper seal ring 20 with an alloy, for example, copper-silver (28–72), that reflows around 800° C. to ensure hermeticity. The entire subassembly is typically nickel and gold plated to provide environmental stability.

Figure 2A:
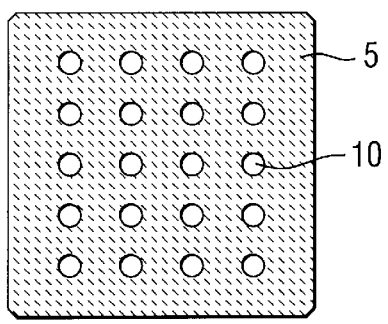
FIGS. 2A–D illustrate a process for forming a package sub-assembly using conductive posts in the vias through the ceramic plate.
Figure 2B:
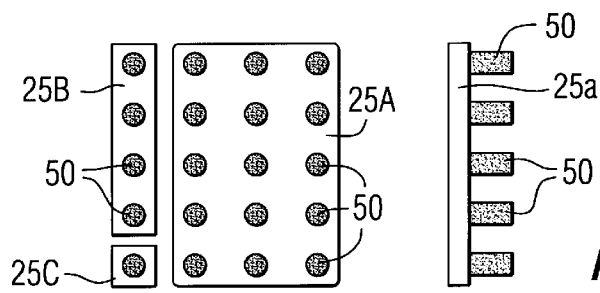
Figure 2C:
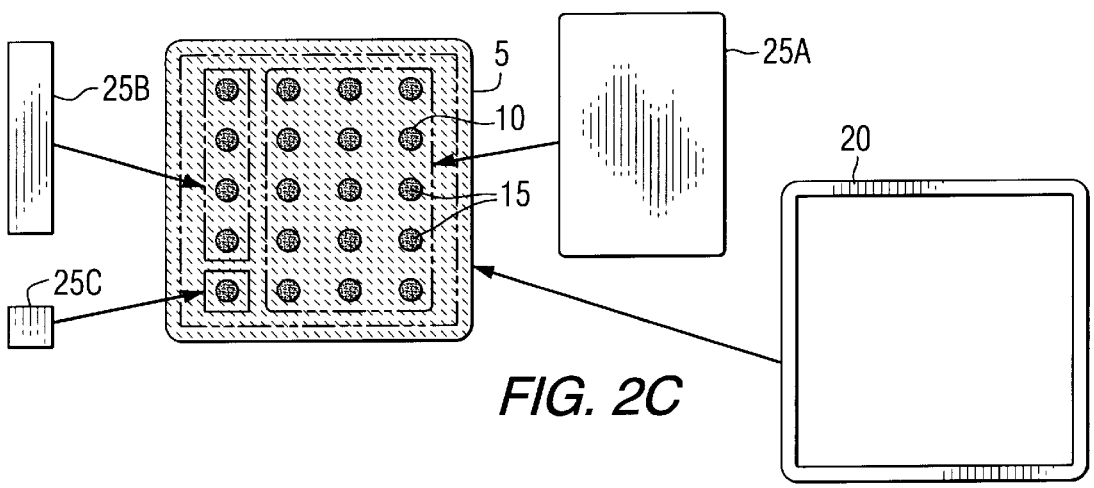

FIGS. 2A–D illustrate an alternative process for forming a package subassembly in accordance with the present invention. In FIG. 2A, as in FIG. 1A, a ceramic plate 5 formed of alumina or other dielectric material may be purchased with holes 10 prepunched or subsequently drilled. As shown in FIGS. 2B and 2C, vias 15 are formed by inserting solid copper posts 50 in holes 10; copper plates 25 A–C are set on ceramic plate 5 in contact with ends of posts 50, which are brazed or direct bonded to plates 25 A–C. A copper seal ring 20 is active metal brazed to the periphery of ceramic plate 5 to facilitate later processing of a Kovar seal ring.

Figure 2D:
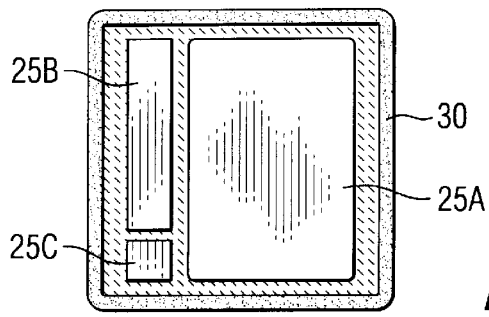

As depicted in FIG. 2D, sidewalls comprising a Kovar seal ring 30 are brazed to copper seal ring 20 using an alloy.

Figure 3:
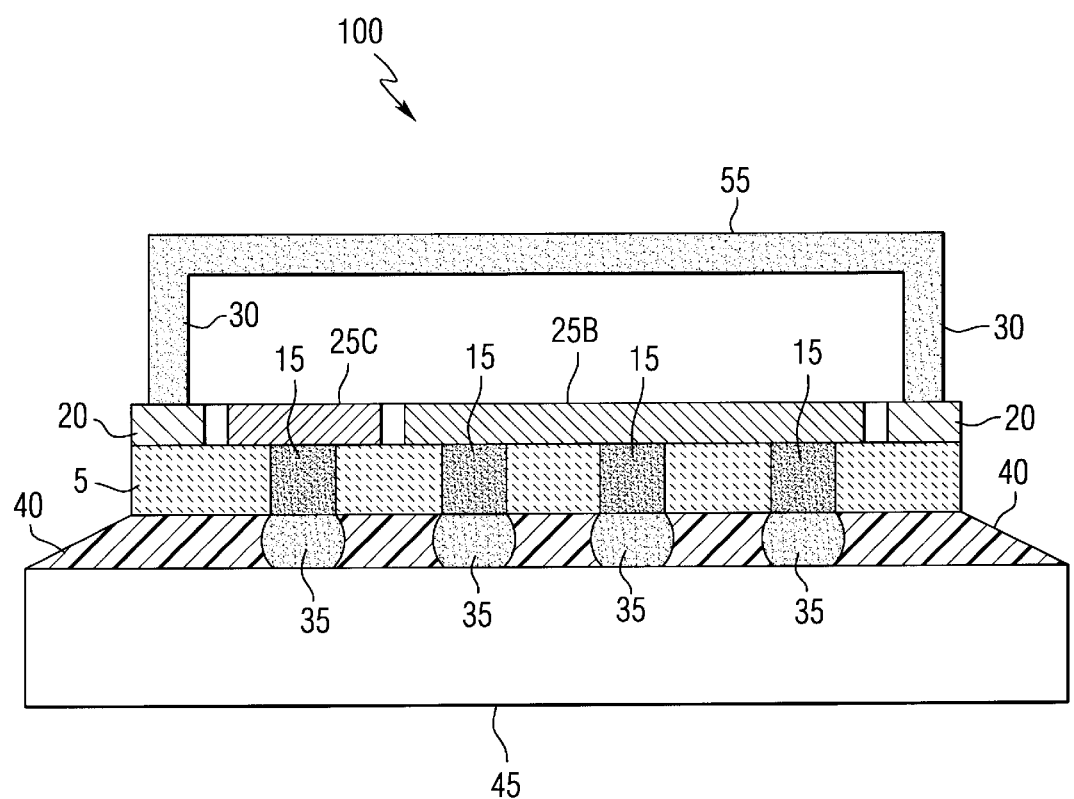
FIG. 3 shows a cross section of the package of the invention attached to a printed circuit board, with one row of the ball grid array visible.

In FIG. 3 is depicted board mounting of the sub-assemblies prepared by either of the processes illustrated in FIGS. 1 A–D and 2 A–D. Solder balls 35 are bonded to vias 15, forming package 100 in contact with a printed circuit board 45. To provide physical reinforcement and stability for the mounted package, an underfill material 40 is placed in the gaps around solder balls 35 between the surfaces of board 45 and ceramic plate 5. Following connection of a semiconductor power device (not shown) to contact pads 25 A–C (A not shown in FIG. 3) lid 55, preferably formed of Kovar alloy, is seam sealed. The package must be hermetically sealed to $1 \times 10^{-8}$ torr. to meet JANS, JANTX and JANTXV requirements ensuring high reliability for military and space/defense applications.

Following are calculations comparing resistance for a standard SMD2 package and an illustrative example of the package of the present invention:

SMD2

The SMD2 RDS resistance is the calculated resistance between the source and the drain in the package. For purposes of this comparison, two (2) 0.015" diameter aluminum wires are used for connections from the top of the die to the source pad. The die is mounted using high-temperature soldering alloy. Resistivities are in ohm-in.

$\rho_{Cu} := 6.48 \cdot 10^{-7} \cdot \text{ohm} \cdot \text{in}$
$\rho_{Al} := 1.1 \cdot 10^{-6} \cdot \text{ohm} \cdot \text{in}$
$\rho_{CuW} := 1.47 \cdot 10^{-6} \cdot \text{ohm} \cdot \text{in}$
$\rho_{via} := 1.15 \cdot \rho_{Cu}$ Calculation of the bond wire resistance (dimensions in cm):

$\text{Length}_1 := .450 \cdot \text{in}$
$\text{Length}_2 := .350 \cdot \text{in}$
$\text{Diameter} := .015 \cdot \text{in}$ $R_{bond1} := \rho_{Al} \cdot \left[ \frac{\text{Length}_1}{\pi \cdot \left(\frac{\text{Diameter}}{2}\right)^2} \right]$   $R_{bond1} = 2.801 \cdot 10^{-3} \, °\text{ohm}$ $R_{bond2} := \rho_{Al} \cdot \left[ \frac{\text{Length}_2}{\pi \cdot \left(\frac{\text{Diameter}}{2}\right)^2} \right]$   $R_{bond2} = 2.179 \cdot 10^{-3} \, °\text{ohm}$ $R_{Parallel12} := \frac{(R_{bond1} \cdot R_{bond2})}{R_{bond1} + R_{bond2}}$   $R_{Parellel12} = 1.225 \cdot 10^{-3} \, °\text{ohm}$ Calculation of the resistance of the 15/85 Cu/W pads:

$\text{Depth}_{pad} := .475 \cdot \text{in}$   $\text{Area}_{pad} := .445 \cdot .017 \cdot \text{in}^2$ $R_{CuWpad} = \rho_{CuW} \cdot \frac{\text{Depth}_{pad}}{\text{Area}_{pad}}$   $R_{CuWpad} = 9.23 \cdot 10^{-5} \, °\text{ohm}$ Calculation of the resistance of the 85/15 Cu/W source pad:

$\text{Depth}_{pad1} := .050 \cdot \text{in}$   $\text{Area}_{pad1} := .095 \cdot .080 \cdot \text{in}^2$
$\text{Depth}_{pad2} := .015 \cdot \text{in}$   $\text{Area}_{pad2} := .140 \cdot .157 \cdot \text{in}^2$ $R_{pad1} = \rho_{CuW} \cdot \frac{\text{Depth}_{pad1}}{\text{Area}_{pad1}}$   $R_{pad1} = 9.671 \cdot 10^{-6} \, °\text{ohm}$ $R_{pad2} = \rho_{CuW} \cdot \frac{\text{Depth}_{pad2}}{\text{Area}_{pad2}}$   $R_{pad2} = 1.00310^{-6} \, °\text{ohm}$ Calculaton of total SMD2 package resistance:

$R_{total} := R_{Parallel12} + R_{CuWpad} + R_{pad1} + R_{pad2}$   $R_{total} = 1.328 \cdot 10^{-3} \, °\text{ohm}$ Power BGA The Power BGA of the present invention is advantageous over the standard SMD2 package in using a larger source pad, thereby enabling more wires to be landed in a given area. Four (4) 0.020" wires are used in this arrangement, and the package is constructed to reduce RDS(on).

Assume the package dimensions are 0.58 in². This package size can handle a size 6 MOSFET. The pad dimensions are 0.300×0.480 for the large pad and 0.100×0.300 for the source pad; the gate pad is not used in this calculation. The thickness of the copper pad is 0.010" and the vias are 0.013" in diameter. The ceramic is 0.020 thick. The number of vias per pad is 45 for the die mount pad plus 12 for the source mount pad.

Calculation of the resistance of one via:

$Length_{via} := .020 \cdot in$    $Diameter_{via} := .013 \cdot in$ $$R_{via} := \rho_{via} \cdot \left[ \frac{Length_{via}}{\pi \cdot \left(\frac{Diameter_{via}}{2}\right)^2} \right]$$

$R_{via} = 1.123 \cdot 10^{-4} \, °ohm$

Calculation of the parallel resistance of all die mount vias:

$Num_{vias} := 45$ $$R_{viaTotal} := \frac{R_{via}}{Num_{vias}}$$

$R_{viaTotal} = 2.495 \cdot 10^{-6} \, °ohm$

Calculaton of the resistance on the die mount area and source:

$Depth_{diemount} := .010 \cdot in$    $Length_{diemount} := .300 \cdot in$    $Width_{diemount} := .480 \cdot in$
$Depth_{sourcepad} := .010 \cdot in$    $Length_{sourcepad} := .100 \cdot in$    $Width_{sourcepad} := .300 \cdot in$
$Num_{spvias} := 12$ $$R_{diemount} := \rho_{Cu} \cdot \frac{Depth_{diemount}}{(Length_{diemount} \cdot Width_{diemount})}$$

$R_{diemount} = 4.5 \cdot 10^{-8} \, °ohm$ $$R_{sourcepad} := \rho_{Cu} \cdot \frac{Depth_{sourcepad}}{(Length_{sourcepad} \cdot Width_{sourcepad})}$$

$R_{sourcepad} = 2.16 \cdot 10^{-7} \, °ohm$ $$R_{sourcepadvias} := \frac{R_{via}}{Num_{spvias}}$$

$R_{sourcepadvias} = 9.357 \cdot 10^{-6} \, °oh$

Calculation of the total wire resistance:

$Num_{wires} := 4$    $Length_{wire} := .390 \, in$    $Diameter_{wire} := .020i$ $$R_{wire} := \rho_{Al} \cdot \left[ \frac{Length_{wire}}{\pi \cdot \left(\frac{Diameter_{wire}}{2}\right)^2} \right]$$

$R_{wire} = 1.366 \cdot 10^{-3} \, °ohm$ $$R_{wireTotal} := \frac{R_{wire}}{Num_{wires}}$$

$R_{wireTotal} = 3.414 \cdot 10^{-4} \, °ohm$

Calculation of the total Power BGA resistance:

$R_{PBGA} := R_{diemount} + R_{sourcepad} + R_{sourcepadvias} + R_{wireTotal}$
$R_{PBGA} = 3.51 \cdot 10^{-4} \, °ohm$ This resistance value calculated for the power BGA of the present invention is about one-fourth of the resistance value calculated for the SMD2 package, nearly a one-milliohm reduction.

The description, summary and range of alternative embodiments described above, together with the figures, portray the invention's benefits in standardizing package connection for power integrated circuits, in improving the reliability and thermal stability of such package connections, and in simplifying the package assembly and mounting process.

The description, embodiments and illustrative material above contain many specificities, which should not be construed as limiting the scope of the invention but as merely providing illustrations and examples of some of the preferred embodiments of the invention, which is defined by the following claims.

What is claimed:

1. A package for mounting a power semiconductor device to a printed circuit board, said package comprising:

a dielectric ceramic plate having an upper and lower surface and a grid array of holes penetrating said plate;

a plurality of conductive metal contact pads disposed on said upper surface of said ceramic plate, said pads providing electrical contact for the power semiconductor device;

conductive metal filling said holes, said metal-filled holes being connected to said conductive metal contact pads and providing vias from said pads to said lower surface of said ceramic plate;

an array of solder balls, each ball being attached to a via at said lower surface of said ceramic plate and providing a connection terminal to the printed circuit board;

sidewalls sealably connected to said ceramic plate at its perimeter; and a lid sealably connected to said sidewalls, said lid comprising, together with said sidewalls and said ceramic plate, a hermetically sealed cavity enclosing the power semiconductor device and conductive metal contact pads.

2. The package of claim 1 wherein said ceramic plate has a rectangular shape.

3. The package of claim 1 wherein said ceramic plate comprises alumina.

4. The package of claim 1 wherein said metal contact pads comprise copper.

5. The package of claim 1 wherein said metal filling said holes comprises copper.

6. The package of claim 5 wherein said metal filling, said holes comprises a copper paste.

7. The package of claim 5 wherein said metal filling each of said holes comprises a copper post.

8. The package of claim 1 wherein said solder balls comprise a lead-tin solder.

9. The package of claim 1 wherein said sidewalls and said lid each comprise a nickel—iron—cobalt alloy.

10. The package of claim 1 further comprising an underfill material disposed on said lower surface of said ceramic plate and surrounding said solder balls.

* * * * *